(12) United States Patent
Shin

(10) Patent No.: US 8,742,439 B2
(45) Date of Patent: Jun. 3, 2014

(54) NITRIDE BASED LIGHT EMITTING DEVICE

(75) Inventor: Johng Eon Shin, Seongnam-si (KR)

(73) Assignees: LG Electronics Inc., Seoul (KR); LG Innotek Co., Ltd., Seoul (KR)

(*) Notice: Subject to any disclaimer, the term of this patent is extended or adjusted under 35 U.S.C. 154(b) by 41 days.

(21) Appl. No.: 13/350,166

(22) Filed: Jan. 13, 2012

(65) Prior Publication Data

US 2012/0112162 A1    May 10, 2012

Related U.S. Application Data

(63) Continuation of application No. 11/702,675, filed on Feb. 6, 2007, now Pat. No. 8,110,841.

(30) Foreign Application Priority Data

May 23, 2006 (KR) .................. 10-2006-0046081

(51) Int. Cl.
*H01L 33/00* (2010.01)
*H01L 33/32* (2010.01)

(52) U.S. Cl.
CPC .................. *H01L 33/32* (2013.01)
USPC .................. 257/97; 257/E33.005

(58) Field of Classification Search
CPC ....... H01L 33/32; H01L 33/06; H01L 33/007; H01L 33/12
USPC ...................... 257/97, 13
See application file for complete search history.

(56) References Cited

U.S. PATENT DOCUMENTS

| | | | |
|---|---|---|---|
| 5,729,029 A | 3/1998 | Rudaz | |
| 6,356,572 B1 * | 3/2002 | Tanaka et al. | 372/45.01 |
| 6,489,636 B1 | 12/2002 | Goetz et al. | |
| 6,555,403 B1 | 4/2003 | Domen et al. | |
| 2006/0086932 A1 | 4/2006 | Kim et al. | |
| 2008/0135852 A1 | 6/2008 | Udagawa | |
| 2008/0149918 A1 | 6/2008 | Yoo et al. | |

FOREIGN PATENT DOCUMENTS

| | | |
|---|---|---|
| JP | 9139543 | 5/1997 |
| JP | 10-242512 | 9/1998 |
| JP | 11-274635 | 10/1999 |
| JP | 2003-273473 | 9/2003 |
| JP | 2004-087763 | 3/2004 |
| KR | 10-2003-0016380 | 2/2003 |
| KR | 10-2004-0083753 | 10/2004 |

* cited by examiner

*Primary Examiner* — Tony Tran
(74) *Attorney, Agent, or Firm* — Mckenna, Long & Aldridge LLP

(57) ABSTRACT

A nitride based light emitting device is disclosed. More particularly, a nitride based light emitting device capable of improving light emitting efficiency and reliability thereof is disclosed. The nitride based light emitting device includes a first conductive semiconductor layer connected to a first electrode, a second conductive semiconductor layer connected to a second electrode, an active layer located between the first conductive semiconductor layer and the second conductive semiconductor layer and having a quantum well structure, a first insertion layer located in at least one of a boundary between the first conductive semiconductor layer and the active layer and a boundary between the second conductive semiconductor layer and the active layer, and a second insertion layer located adjacent to the first insertion.

7 Claims, 14 Drawing Sheets

NITRIDE BASED LIGHT EMITTING DEVICE

This application is a continuation of allowed U.S. application Ser. No. 11/702,675, filed Feb. 6, 2007, now U.S. Pat. No. 8,110,841 which claims the benefit of Korean Patent Application No. 10-2006-0046081, filed on May 23, 2006, both of which are hereby incorporated by reference in their entirety for all purposes as if fully set forth herein.

BACKGROUND OF THE INVENTION

1. Field of the Invention

The present invention relates to a nitride based light emitting device, and more particularly, to a nitride based light emitting device which can achieve an improvement in light emitting efficiency and reliability.

2. Discussion of the Related Art

Light emitting diodes (LEDs) are well known as a semiconductor light emitting device which converts current to light, to emit light. Since a red LED using GaAsP compound semiconductor was commercially available in 1962, it has been used, together with a GaP:N-based green LED, as a light source in electronic apparatuses including telecommunication apparatuses, for image display.

The wavelength of light emitted from such an LED depends on the semiconductor material used to fabricate the LED. This is because the wavelength of the emitted light depends on the band gap of the semiconductor material representing energy difference between valence-band electrons and conduction-band electrons.

Gallium nitride (GaN) compound semiconductor has been highlighted in the field of high-power electronic devices because it exhibits a high thermal stability and a wide band gap of 0.8 to 6.2 eV.

One of the reasons why GaN compound semiconductor has been highlighted is that it is possible to fabricate semiconductor layers capable of emitting green, blue, and white light, using GaN in combination with other elements, for example, indium (In), aluminum (Al), etc.

Thus, it is possible to adjust the wavelength of light to be emitted, using GaN in combination with other appropriate elements. Accordingly, where GaN is used, it is possible to appropriately determine the materials of a desired LED in accordance with the characteristics of the apparatus to which the LED is applied. For example, it is possible to fabricate a blue LED useful for optical recording or a white LED to replace a glow lamp.

By virtue of the above-mentioned advantages and other advantages of GaN-based LEDs, the GaN-based LED market has rapidly grown. Also, techniques associated with GaN-based electro-optic devices have rapidly developed since the GaN-based LEDs became commercially available in 1994.

The brightness and power-output of the above described GaN-based LEDs generally depend on the structure of an active layer, the extraction efficiency of light to the outside, the size of LED chips, the kind and installation angle of a mold that is required for assembling of a lamp package, fluorescent materials, etc.

Meanwhile, one of the reasons why the GaN-based semiconductors have a difficulty in growth as compared to other III-V compound semiconductors is that there are no high quality substrates, namely, wafers made of GaN, InN, AlN, or the like.

Accordingly, an LED structure is grown on a heterogeneous substrate, such as a sapphire substrate. This may cause many defects having a serious effect on the performance of the resulting LED.

FIG. 1 illustrates the basic structure of a GaN based LED. As shown in FIG. 1, an n-type GaN semiconductor layer 10 is first provided, and then, an active layer 20 having a quantum well structure is located adjacent to the n-type GaN semiconductor layer 10. In turn, a p-type GaN semiconductor layer 30 is located adjacent to the active layer 20.

As shown, the above described LED structure is grown over a substrate 40. An electrode will be formed on the LED structure in the following process. With injection of electric changes through the electrode, the resulting LED is able to emit light.

FIG. 2 is an energy band diagram of the above LED structure.

In this case, a well 21 and a barrier 22, which constitute the quantum well structure of the active layer 20, are made of GaN and InGaN, but GaN and InGaN have a large difference between their lattice constants. Therefore, with such a large difference between the lattice constants of the well 21 and the barrier 22, the active layer 20 must be affected by a serious strain that causes imperfections in solids, such as, dislocation.

Moreover, the strain is locally generated, and thus, may hinder efficient electron-hole coupling required for emitting light. Accordingly, there is a need for adjustment of the strain.

To adjust the strain, although not shown, an InGaN layer may be inserted into a part of the active layer. However, the partially inserted InGaN layer may restrict efficient confinement of electrons and holes within an active layer, thus causing a degradation in optical efficiency.

SUMMARY OF THE INVENTION

Accordingly, the present invention is directed to a nitride based light emitting device that substantially obviates one or more problems due to limitations and disadvantages of the related art.

An object of the present invention is to provide a nitride based light emitting device which can adjust or restrict generation of strain and imperfections in solids, and achieve efficient confinement of electrons and holes within an active layer, resulting in an improvement in the reliability of the light emitting device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with a first aspect of the invention, as embodied and broadly described herein, a nitride based light emitting device comprises: a first conductive semiconductor layer connected to a first electrode; a second conductive semiconductor layer connected to a second electrode; an active layer located between the first conductive semiconductor layer and the second conductive semiconductor layer and having a quantum well structure; at least one first insertion layer located in at least one of a boundary between the first conductive semiconductor layer and the active layer and a boundary between the second conductive semiconductor layer and the active layer, the first insertion layer having an energy band gap between a barrier layer and a well layer of the active layer; and at least one second insertion layer located adjacent to the first insertion layer and having a larger energy band gap than that of the barrier layer of the quantum well structure.

In accordance with a second aspect of the invention, there is provided a nitride based light emitting device comprising: a first conductive semiconductor layer; an active layer located on the first conductive semiconductor layer and having a quantum barrier layer and a quantum well layer; a second conductive semiconductor layer located on the active layer; a first semiconductor layer located in at least one of a boundary between the first conductive semiconductor layer and the active layer and a boundary between the second conductive semiconductor layer and the active layer, the first semiconductor layer having an energy band gap between the quantum barrier layer and the quantum well layer; and a second semiconductor layer located adjacent to the first semiconductor layer and having a larger energy band value than that of the quantum barrier layer.

In accordance with a third aspect of the invention, there is provided a nitride based light emitting device comprising: a first conductive semiconductor layer; an active layer located on the first conductive semiconductor layer and having a quantum barrier layer and a quantum well layer; a second conductive semiconductor layer located on the active layer; a first semiconductor layer located in at least one of a boundary between the first conductive semiconductor layer and the active layer and a boundary between the second conductive semiconductor layer and the active layer, the first semiconductor layer having a lattice constant between those of the quantum barrier layer and the quantum well layer; and a second semiconductor layer located adjacent to the first semiconductor layer and having a larger energy band value than that of the quantum barrier layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
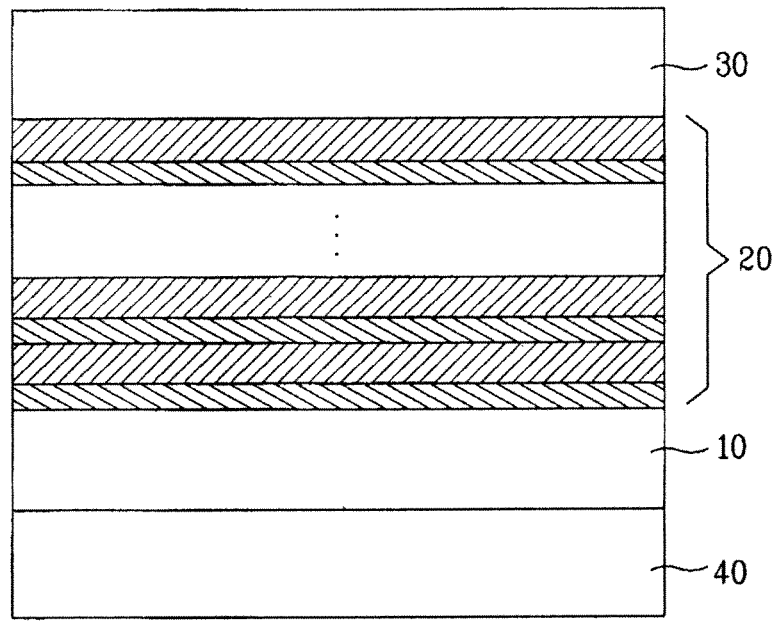
FIG. 1 is a sectional view illustrating an exemplary process for forming a conventional light emitting device.
Figure 2:
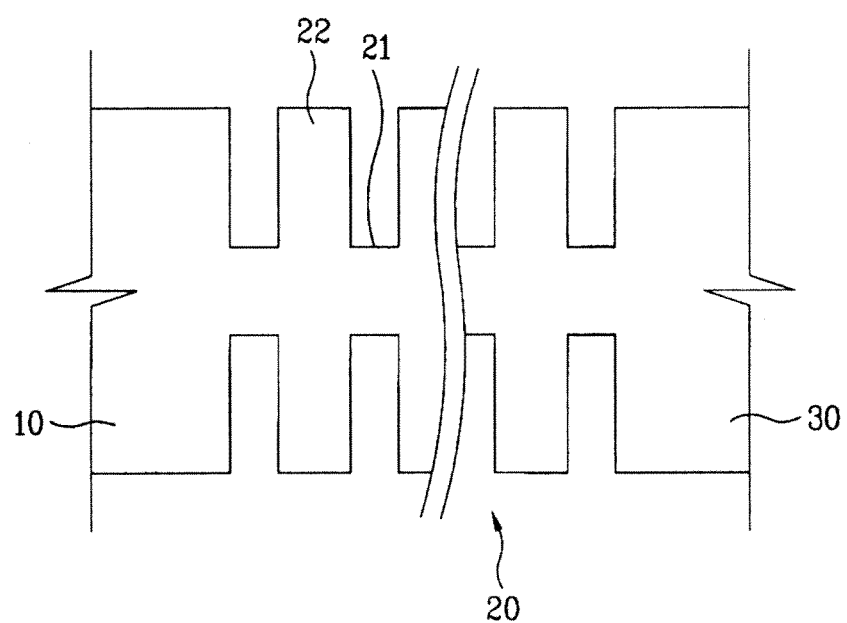
FIG. 2 is an energy band diagram of the light emitting device shown in FIG. 1.

Reference will now be made in detail to the preferred embodiments of the present invention, examples of which are illustrated in the accompanying drawings.

The present invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

The same reference numbers will be used throughout the drawings to refer to the same or like parts. In the drawings, dimensions of layers and regions are exaggerated for clarity of description.

It will be understood that, when an element such as a layer, region or substrate is referred to as being "on" another element, it can be directly on the other element or intervening elements may also be present. It will also be understood that if part of an element, such as a surface, is referred to as "inner," it is farther to the outside of the device than other parts of the element.

In addition, relative terms, such as "beneath" and "overlies", may be used herein to describe one layer's or region's relationship to another layer or region as illustrated in the figures.

It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms.

The above terms first, second, etc. are used simply to discriminate any one element, component, region, layer, or area from other elements, components, regions, layers, or areas. Accordingly, the term first region, first layer, first area, etc., which will be described hereinafter, may be replaced by the term second region, second layer, or second area.

Figure 3:
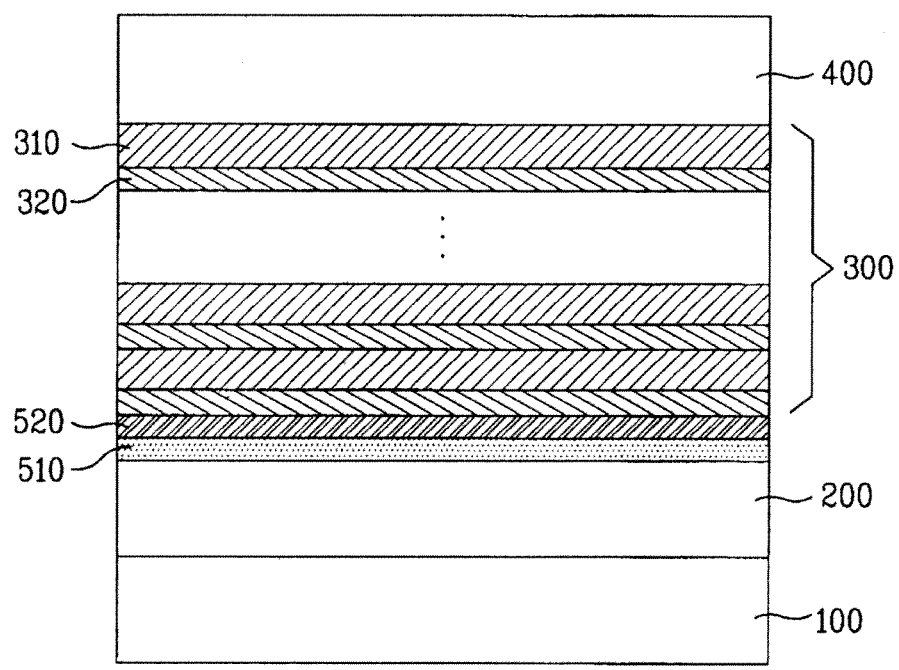
FIG. 3 is a sectional view illustrating a process for forming a light emitting device according to a first embodiment of the present invention.

Referring to FIG. 3, an n-type GaN semiconductor layer 200 is formed over a substrate 100, and in turn, an active layer 300 is formed over the n-type GaN semiconductor layer 200. In addition, a p-type GaN semiconductor layer 400 is formed over the active layer 300.

Alternatively, although not shown, the p-type semiconductor layer 400 may be firstly formed over the substrate 100. In this case, the n-type semiconductor layer 200 is located over the active layer 300.

The substrate 100 may be a heterogeneous substrate, such as a sapphire substrate or SiC substrate.

Additionally, although not shown, an undoped GaN semiconductor layer may be formed, as a buffer layer, between the substrate 100 and the n-type semiconductor layer 200.

The active layer 300 has a single quantum well (SQW) structure or multi-quantum well (MQW) structure. A quantum barrier layer 310 is made of any one selected from GaN, GaInN, and AlGaInN, and a quantum well layer 320 is made of any one of GaInN and AlGaInN.

Hereinafter, the quantum barrier layer and the quantum well layer are referred to as a barrier layer 310 and a well layer 320.

The barrier layer 310 has a larger energy band gap than that of the well layer 320. When both the barrier layer 310 and the well layer 320 are made of GaInN, the well layer 320 may contain a larger indium (In) composition than that of the barrier layer 310.

Similarly, when both the barrier layer 310 and the well layer 320 are made of AlGaInN, In and Al compositions may be appropriately adjusted with respect to each other, to form the barrier layer 310 and the well layer 230.

FIG. 3 illustrates a state wherein both the barrier layer 310 and the well layer 320 are made of GaInN. As stated above, the well layer 320 may have the larger In composition than that of the barrier layer 310. The barrier layer 310 may be made of GaN.

Figure 4:
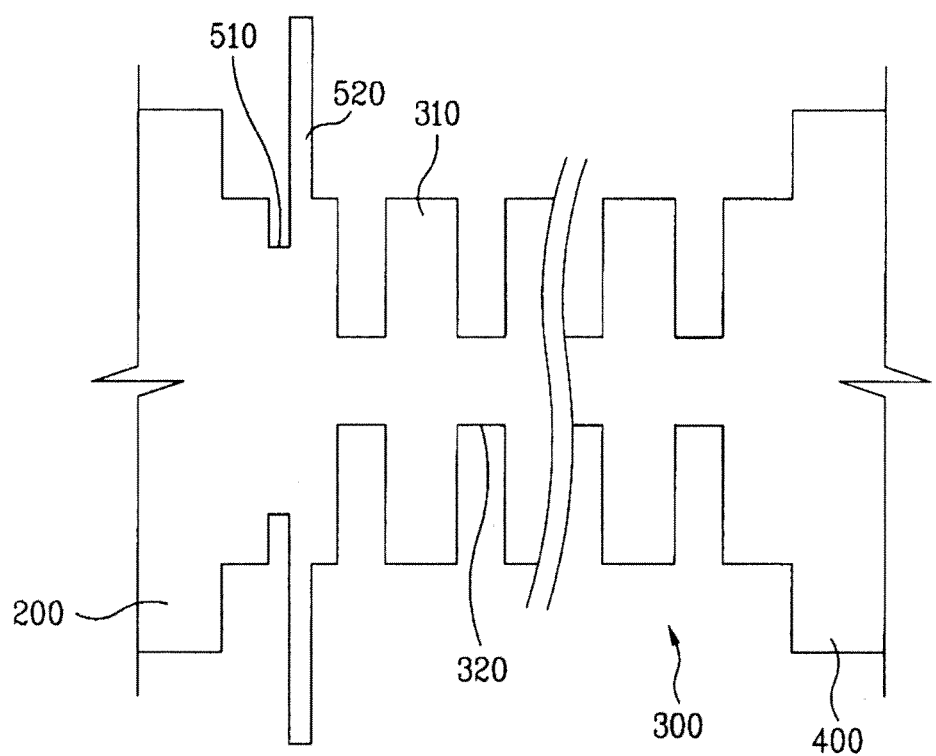
FIG. 4 is an energy band diagram of the light emitting device shown in FIG. 3.

FIG. 4 is an energy band diagram of the LED structure shown in FIG. 3.

A first insertion layer 510 is located at a boundary between the active layer 300 of the quantum well structure and the n-type semiconductor layer 200. The first insertion layer 510 is made of GaInN. In addition, a second insertion layer 520 is located adjacent to the first insertion layer 510.

More specifically, the first insertion layer 510 is located between the n-type GaN semiconductor layer 200 and the first well layer 320 of the active layer 300. Indium (In) composition in the GaInN first insertion layer 510 has a value between the In composition of the barrier layer 310 and the In composition of the well layer 320. That is to say, the first insertion layer 510 is a semiconductor layer having a different composition ratio from that of the barrier layer 310 or well layer 320 of the active layer 300.

The first insertion layer 510 serves to relieve strain that is caused by a difference between lattice constants of the n-type GaN semiconductor layer 200 and the active layer 300 of the quantum well structure, and to ensure smooth supply of electric current.

The In composition of $Ga_{1-x}In_xN$ constituting the first insertion layer 510 is larger than zero (0<x), and smaller than the In composition of the active layer 300. For example, if the In composition of the active layer 300 is 0.2 (x=0.2), the In composition of $Ga_{1-x}In_xN$ constituting the first insertion layer 510 may be between 0 and 0.2 (0<x<0.2).

To achieve more efficient adjustment of strain and supply of electric current, it is preferable that the In composition of $Ga_{1-x}In_xN$ be selected within a range of 0.01 to 0.1 (0.01<x<0.1).

An AlGaInN layer having a large energy band gap is grown adjacent to the first insertion layer 510, to form the second insertion layer 520. That is to say, the second insertion layer 510 is a semiconductor layer having a different composition ratio from that of the barrier layer 310 or well layer 320 of the active layer 300.

The second insertion layer 520 serves to achieve efficient confinement of carriers, such as electrons and holes, within the active layer 300, thereby achieving an increase in optical efficiency.

Although Al and Ga compositions of $Al_yGa_{1-x-y}In_xN$ constituting the second insertion layer 510 may have a value between 0 and 1 (0<1−x−y, y<1), it is preferable that the second insertion layer 520 have a higher band gap energy than that of the adjacent barrier layer 310, for the sake of more efficient carrier confinement.

For example, if the band gap energy of GaInN constituting the barrier layer 310 is 3.2 eV, compositions of respective elements of AlGaInN may be selected such that the band gap energy of AlGaInN constituting the second insertion layer 520 is higher than 3.2 eV.

Preferably, of $Al_yGa_{1-x-y}In_xN$ constituting the second insertion layer 520, the Al composition is within a range of 0.05 to 0.5 (0.05<y<0.5), and the In composition is within a range of 0.02 to 0.2 (0.02<x<0.2).

Figure 5:
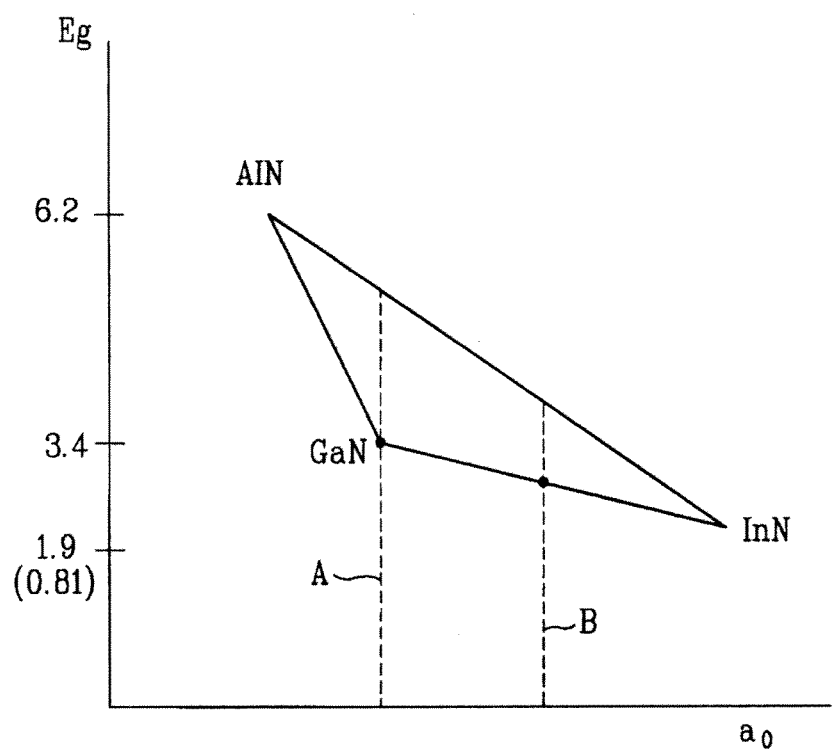
FIG. 5 is a graph illustrating the relationship of a band gap energy and a lattice constant.

FIG. 5 illustrates a graph illustrating the relationship of a band gap energy ($E_g$) and a lattice constant ($a_0$) with respect to three materials including GaN, AlN, and InN.

For example, in the graph, the line connecting AlN and GaN to each other represents the relationship of the band gap energy and the lattice constant, depending on the Al and Ga compositions of AlGaN. Similarly, the line connecting GaN and InN to each other represents the relationship of the band gap energy and the lattice constant, depending on the Ga and In compositions of GaInN.

Accordingly, if the composition of any one material is determined, the composition of the other material to be used is determined on the basis of the determined result such that the two materials have the same lattice constant as each other. This has the effect of preventing the resulting following layer from being affected by strain.

For example, when using a GaN material, it is preferable that the composition of the material be on the dotted line A, for the sake of eliminating the effect of strain.

In the same manner as the first insertion layer 510 and the second insertion layer 520 of the present invention, it is possible to achieve a layer, which has an appropriate energy band gap and is free from strain.

For example, the first insertion layer 510 is made of GaInN, the first insertion layer 510 has an energy band gap between the barrier layer 310 and the well layer 320 of the active layer 300. The first insertion layer 510 can serve not only to relieve strain, but also to ensure efficient flow of carriers such as electrons and holes.

In this case, if the Al and In compositions of the second insertion layer 520 are determined to be on the dotted line B that corresponds to the composition of the first insertion layer 510, the second insertion layer 520 can be free from strain.

Accordingly, the first and second insertion layers 510 and 520 can prevent the respective semiconductor layers including the active layer 300 from being affected by strain. Also, the first and second insertion layers 510 and 520 can ensure not only efficient flow of carriers, but also confinement of the carriers within the active layer 300.

In conclusion, the structure including the insertion layers 510 and 520 can achieve a fundamental improvement in the lifespan, electro-static discharge (ESD) property, reverse leakage current ($I_r$), etc. of a light emitting diode. In particular, with the use of such a high-quality thin film having less defects, it is possible to achieve an improvement in the reliability of the light emitting device.

Figure 13:
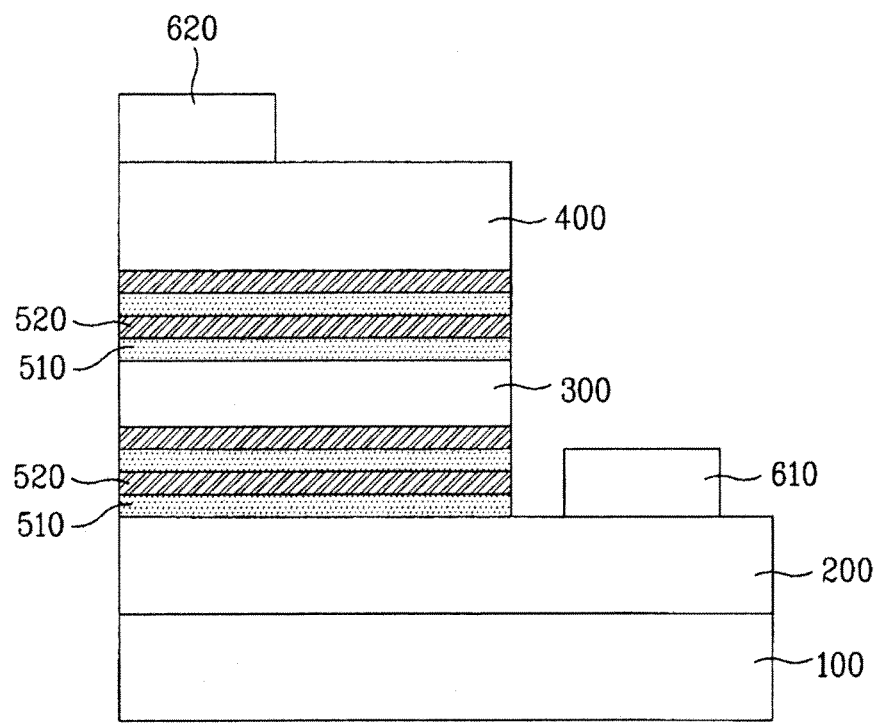
FIG. 13 is a sectional view illustrating an example of a light emitting device according to the present invention.
Figure 14:
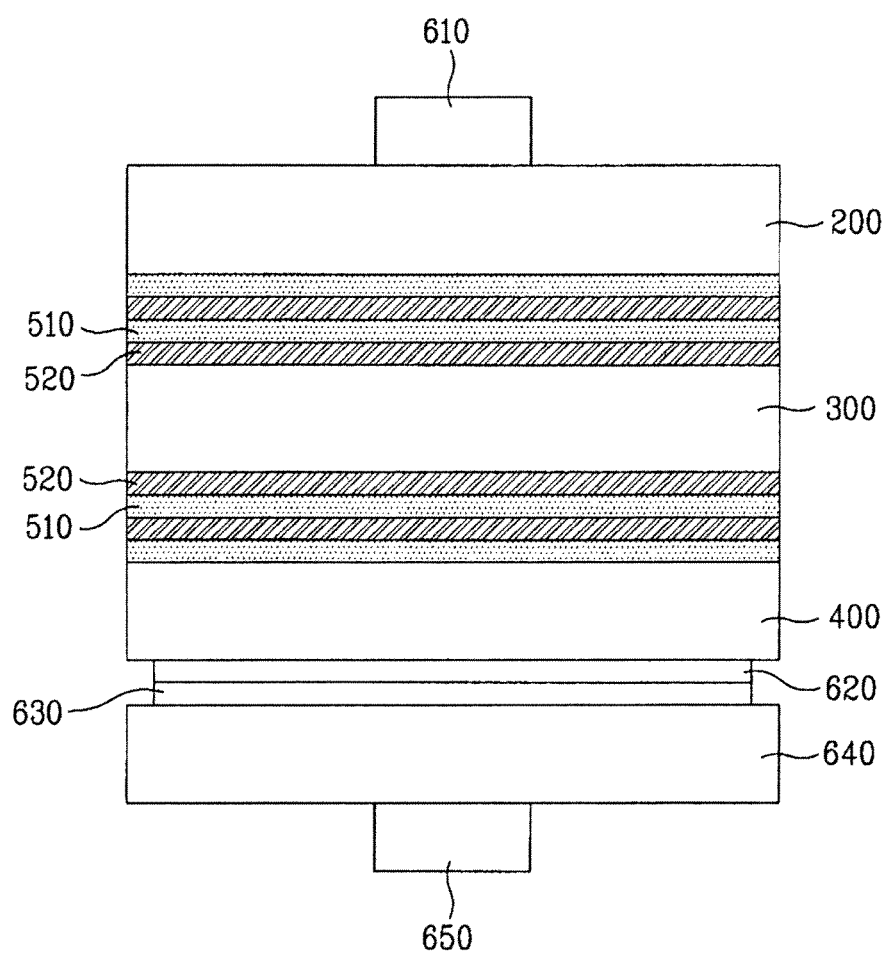
FIG. 14 is a sectional view illustrating another example of a light emitting device according to the present invention.

The structure of the light emitting device including the insertion layers 510 and 520 are illustrated in FIGS. 13 and 14.

As shown in FIG. 13, an n-type GaN semiconductor layer 200 is formed over a substrate 100, and in turn, an active layer 300 is formed over the n-type GaN semiconductor layer 200. In a state wherein a p-type GaN semiconductor layer 400 is formed over the active layer 300, an etching process is performed to expose a part of the n-type semiconductor layer 200 to the outside. Then, an n-type electrode 610 is formed on the exposed n-type semiconductor layer 200, and a p-type electrode 620 is formed on the p-type semiconductor layer 400.

In this case, the first insertion layer 510 and the second insertion layer 520 define two alternate phases, and are located between the n-type semiconductor layer 200 and the active layer 300 and between the p-type semiconductor layer 400 and the active layer 300.

FIG. 14 illustrates a vertical type light emitting device having the above described first insertion layer 510 and the second insertion layer 520. Specifically, the n-type GaN semiconductor layer 200 is formed over the substrate 100, and the active layer 300 is formed over the n-type GaN semiconductor layer 200. In a state wherein the p-type GaN semiconductor layer 400 is formed over the active layer 300, the substrate 100 is removed to expose the n-type semiconductor layer 200 to the outside. Thereafter, the n-type electrode 610 is formed on the exposed n-type semiconductor layer 200.

In addition, the p-type electrode 620 is formed on the p-type semiconductor layer 400. As occasion demands, as shown in FIG. 14, a reflective electrode 630 is formed over the p-type electrode 620, to reflect light generated from the active layer 300. This has the effect of improving the light extraction efficiency of the light emitting device.

A supporting layer 640 is formed at an outer surface of the reflective electrode 630. The supporting layer 640 is made of a semiconductor wafer or metal, and serves to support the resulting light emitting device structure in the course of separating the substrate 100.

In this case, a metal pad 650 is formed at an outer surface of the supporting layer 640, for connection of a package.

Hereinafter, several detailed embodiments of the present invention will be described with reference to the drawings.

<First Embodiment>

As described above with reference to FIG. 3, the n-type GaN semiconductor layer 200 is formed over the substrate 100. The active layer 300, which is made of GaInN, is formed over the n-type GaN semiconductor layer 200, and in turn, the p-type GaN semiconductor layer 400 is formed over the active layer 300.

In this case, the In composition within the well layer 320 of the active layer 300 may be larger than the In composition of the barrier layer 310.

FIG. 4 is an energy band diagram of the structure shown in FIG. 3. The first insertion layer 510, which is made of GaInN, is located at a boundary between the active layer 300 of the quantum well structure and the n-type semiconductor layer 200, and the second insertion layer 520 is located adjacent to the first insertion layer 510.

More specifically, the first insertion layer 510 is located between the n-type GaN semiconductor layer 200 and the first well layer 320 of the active layer 300. The In composition of GaInN constituting the first insertion layer 510 may be equal to the In composition within the well layer 320.

The first insertion layer 510 can relieve strain caused by a difference in lattice constants between the n-type GaN semiconductor layer 200 and the active layer 300 of the quantum well structure, and ensure smooth supply of electric current.

<Second Embodiment>

Figure 6:
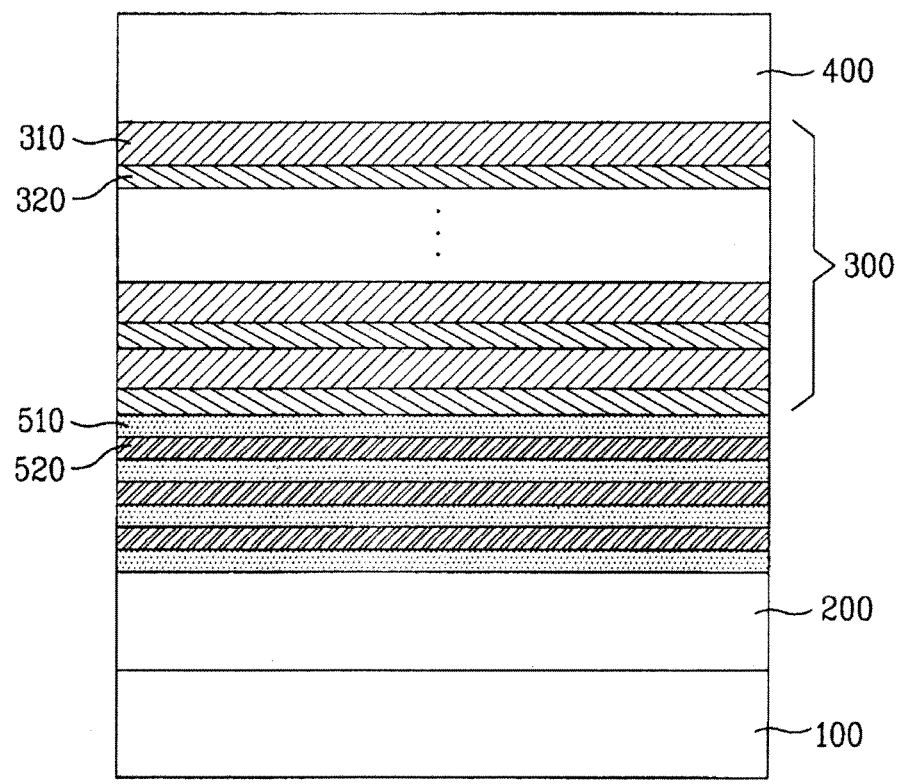
FIG. 6 is a sectional view illustrating a process for forming a light emitting device according to a second embodiment of the present invention.

As shown in FIG. 6, the n-type GaN semiconductor layer 200 is formed over the substrate 100, and the active layer 300 is formed over the n-type GaN semiconductor layer 200. In turn, the p-type GaN semiconductor layer 400 is formed over the active layer 300.

In this case, the first insertion layer 510, which is made of GaInN, and the second insertion layer 510, which is made of AlGaInN, are formed between the n-type semiconductor layer 200 and the active layer 300. Specifically, there are provided a plurality of first insertion layers 510 and a plurality of second insertion layers 520, which are arranged alternately. That is to say, each first insertion layer 510 may pair with the corresponding second insertion layer 520.

Figure 7:
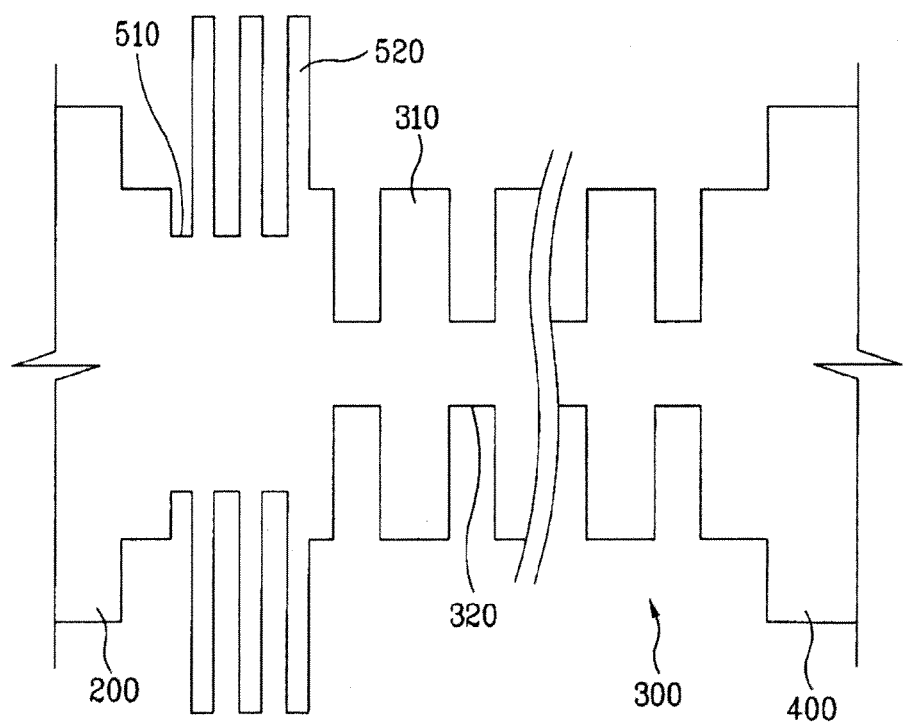
FIG. 7 is an energy band diagram of the light emitting device shown in FIG. 6.

FIG. 7 is an energy band diagram of the above described structure according to the present embodiment. As shown, both the barrier layer 310 and the well layer 320 of the active layer 300 are made of GaInN, and the first insertion layer 510 has a band gap energy between those of the barrier layer 310 and the well layer 320.

The energy band gap of the second insertion layer 520 is larger than that of the barrier layer 310. As occasion demands, the energy band gap of the second insertion layer 520 may be larger than that of the n-type semiconductor layer 200.

When the insertion layers 510 and 520 made of GaInN/AlGaInN are repeatedly provided more than two cycles, it is possible to achieve a further improvement in the brightness and reliability of the light emitting device.

In this case, the thickness of each of the insertion layers 510 and 520, made of GaInN/AlGaInN, is within a range of 5 to 50 Å. When a pair of insertion layers 510 and 520 made of GaInN/AlGaInN is provided from one cycle to one hundred cycles, it is possible to achieve an outstanding improvement in properties of the light emitting device.

That is to say, on the basis of the pair of first and second insertion layers 510 and 520, one pair to one hundred pairs of the first and second insertion layers 510 and 520 can be used, and preferably, one pair to fifty pairs of the first and second insertion layers 510 and 520 can be formed.

<Third Embodiment>

Figure 8:
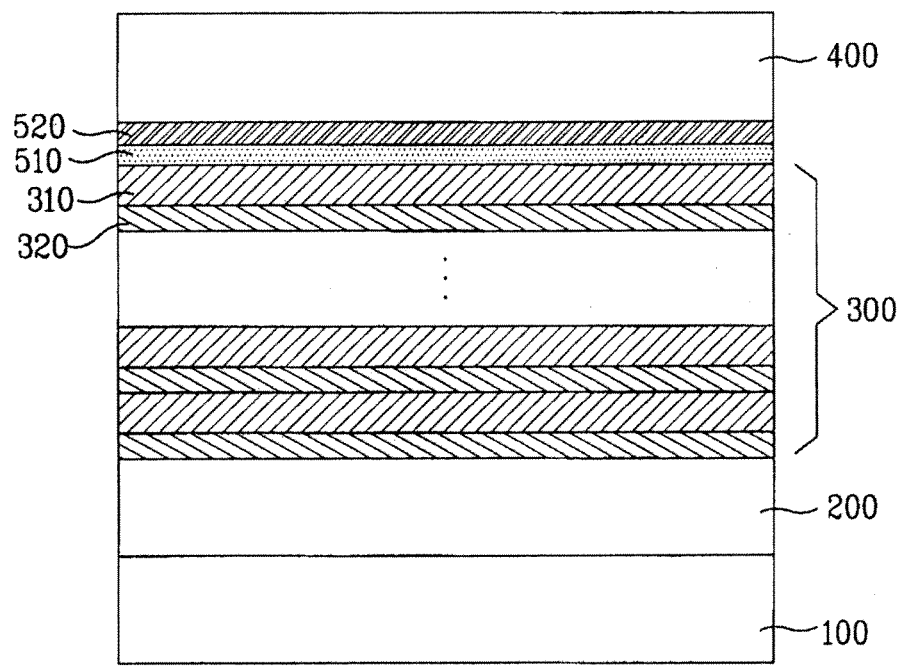
FIG. 8 is a sectional view illustrating a process for forming a light emitting device according to a third embodiment of the present invention.

As shown in FIG. 8, the insertion layers 510 and 520, made of GaInN/AlGaInN, may be formed between the active layer 300 and the p-type GaN semiconductor layer 400.

The insertion layers 510 and 520 may be located between the active layer 300 and the p-type GaN semiconductor layer 400. Similar to the above mentioned insertion layers between the n-type GaN semiconductor layer 200 and the active layer 300, the insertion layers 510 and 520 can relieve strain, and achieve an improvement in the supply of electric current and the confinement of carriers.

Figure 9:
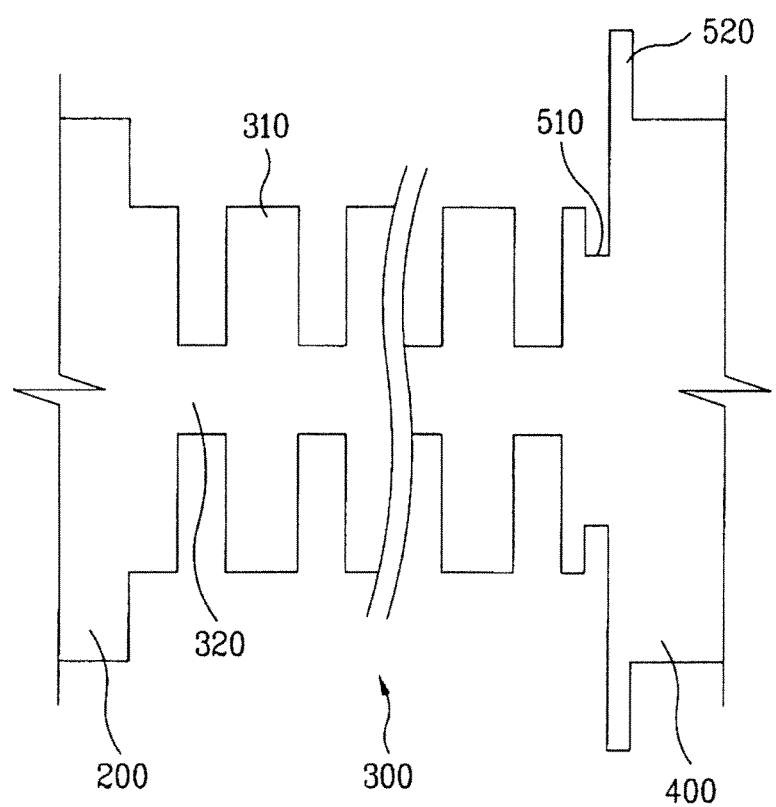
FIG. 9 is an energy band diagram of the light emitting device shown in FIG. 8.

FIG. 9 is an energy band diagram of the above described structure. As shown, the first insertion layer 510 may be located adjacent to the active layer 300, and the second insertion layer 520 may be located at the outside of the first insertion layer 510. Alternatively, the second insertion layer 520 may be located adjacent to the active layer 300, and the first insertion layer 510 may be located at the outside of the second insertion layer 520.

<Fourth Embodiment>

Figure 10:
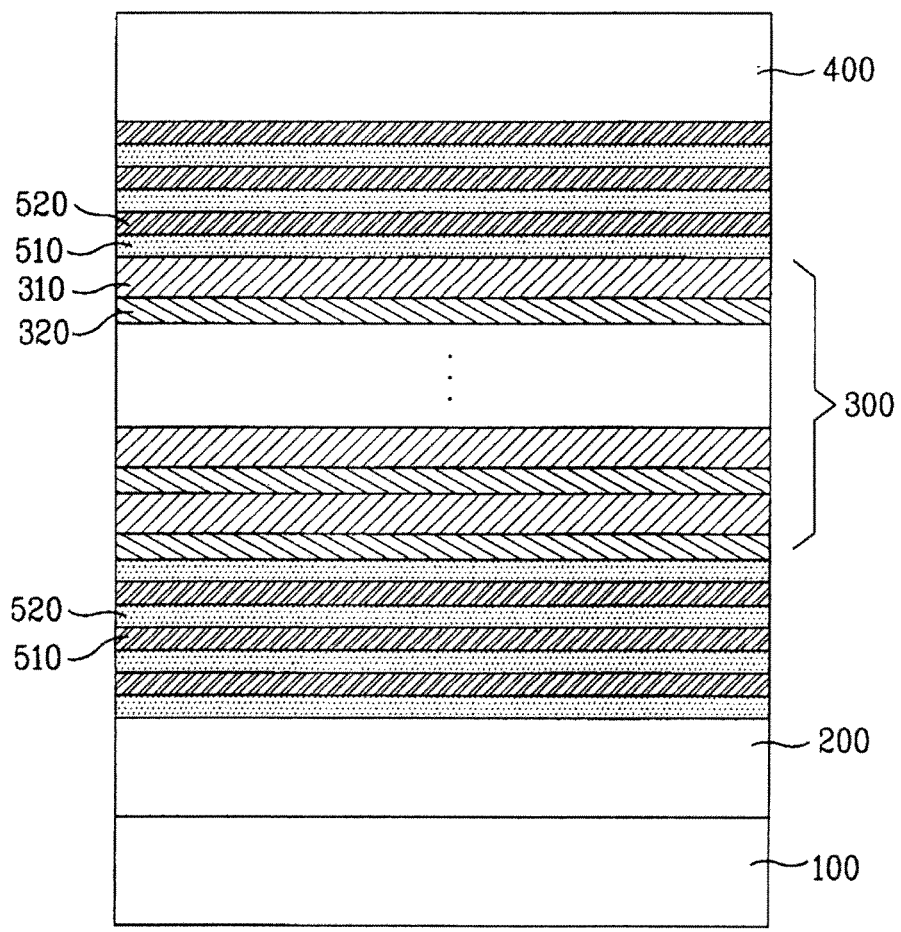
FIG. 10 is a sectional view illustrating a process for forming a light emitting device according to a fourth embodiment of the present invention.

As shown in FIG. 10, the n-type semiconductor layer 200, the active layer 300, and the p-type semiconductor layer 400 are sequentially formed, from the bottom, over the substrate 100. A plurality of insertion layers 510 and 520, made of GaInN/AlGaInN, are alternately formed between the n-type semiconductor layer 200 and the active layer 300 and between the p-type semiconductor layer 400 and the active layer 300.

Figure 11:
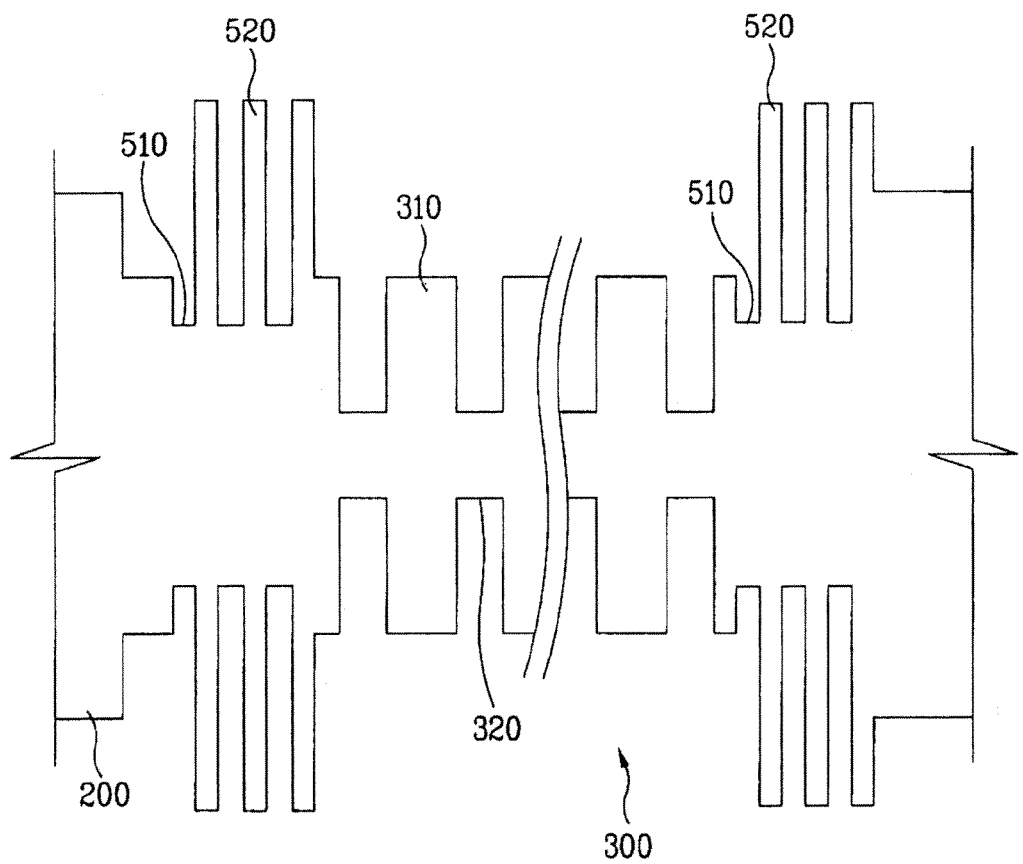
FIG. 11 is an energy band diagram of the light emitting device shown in FIG. 10.

The present embodiment illustrates that the barrier layer 310 and the well layer 320 of the active layer 300 are made of GaInN. FIG. 11 is an energy band diagram of the above described structure.

In the present embodiment, during the growth of the GaInN/AlGaInN insertion layers 510 and 520, an n-type dopant, more particularly, Si is injected into the GaInN/AlGaInN insertion layers 510 and 520 formed between the active layer 300 and the n-type semiconductor layer 200. Also, a p-type dopant, more particularly, Mg is injected into the GaInN/AlGaInN insertion layers 510 and 520 formed between the active layer 300 and the p-type semiconductor layer 400. This has the effect of ensuring efficient flow of electrons and holes while obtaining a great amount of carriers.

<Fifth Embodiment>

Figure 12:
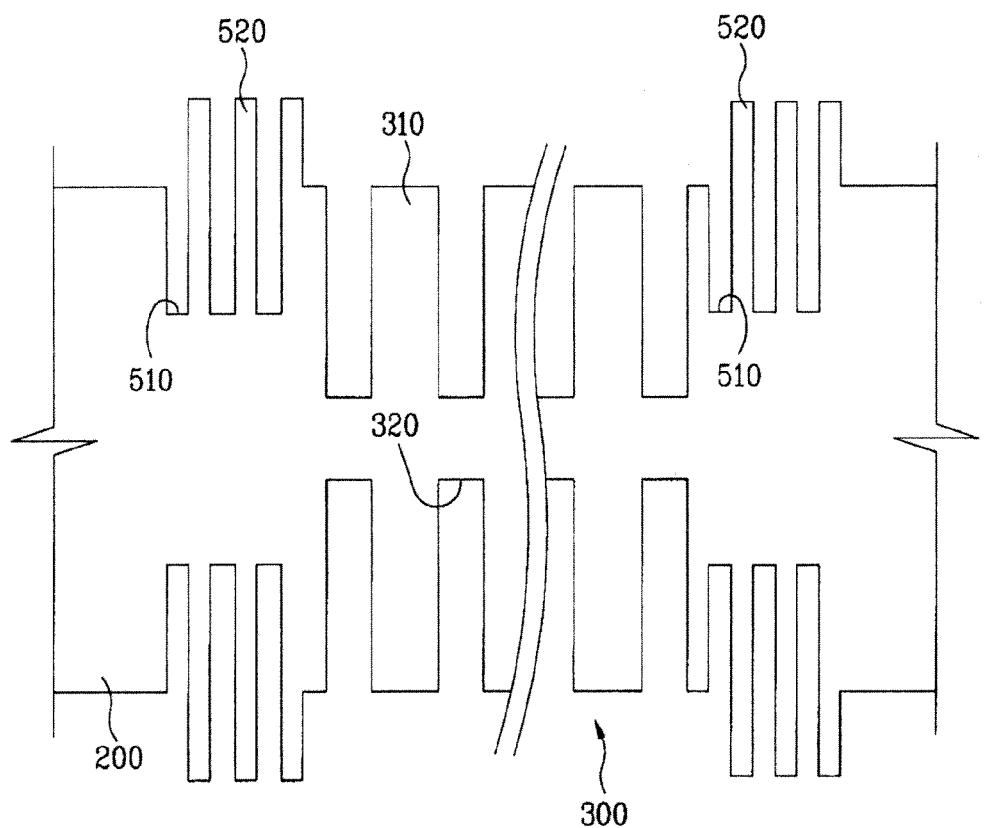
FIG. 12 is a sectional view illustrating a process for forming a light emitting device according to a fifth embodiment of the present invention.

In the present embodiment, the n-type semiconductor layer 200, the active layer 300, and the p-type semiconductor layer 400 are sequentially formed, from the bottom, over the substrate 100. A plurality of insertion layers 510 and 520, made of GaInN/AlGaInN, are alternately formed between the n-type semiconductor layer 200 and the active layer 300 and between the p-type semiconductor layer 400 and the active layer 300. FIG. 12 is an energy band diagram of the above described structure.

In this case, the barrier layer 310 of the active layer 300 is made of GaN, and the well layer 320 is made of GaInN.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A nitride based light emitting device comprising:
    a n-type semiconductor layer connected to a first electrode;
    a p-type semiconductor layer connected to a second electrode;
    an active layer located between the n-type semiconductor layer and the p-type semiconductor layer, the active layer comprising a quantum well structure, wherein the active layer comprises a barrier layer and a well layer;
    a plurality of first insertion layers located between the n-type semiconductor layer and the active layer or between the p-type semiconductor layer and the active layer, the plurality of first insertion layers having an energy band gap between the energy band gap of the n-type semiconductor layer and the energy band gap of the well layer, wherein at least two of the plurality of first insertion layers have substantially the same thickness and substantially the same energy band gap, and wherein the plurality of first insertion layers comprise GaInN;
    a plurality of second insertion layers located adjacent to the plurality of first insertion layers and having a greater energy band gap than that of the first insertion layer, wherein the plurality of first and second insertion layers are alternately arranged; and
    a supporting layer on the second electrode, the supporting layer is made of metal,
    wherein a side edge of the second electrode is indented from a side edge of the first insertion layer,
    wherein the second electrode includes a first layer on the p-type semiconductor layer and a reflective layer and a reflective electrode on the first layer, and a width of the first layer is substantially the same as a width of the reflective electrode,
    wherein the second electrode is disposed between the p-type semiconductor layer and the supporting layer, and
    wherein a side edge of the second electrode is indented from a side edge of the supporting layer, and the side edge of the second layer is exposed;
    wherein the plurality of first insertion layers has an energy band gap between the energy band gap of the barrier layer and the energy band gap of the well layer; and
    wherein the plurality of second insertion layers has an energy band gap greater than that of the barrier layer.

2. The device according to claim 1, further comprising a metal pad on the supporting layer.

3. The device according to claim 1, wherein, when the plurality of first insertion layers is represented as $Ga_{1-x}In_xN$, an indium (In) composition is represent as condition, $0.01<x<0.1$.

4. The device according to claim 1, wherein a degree of indentation of the side edge of the second electrode is substantially the same as that of an opposite side edge of the second electrode.

5. The device according to claim 1, wherein the plurality of the first insertion layers is configured to relieve strain due to a lattice mismatch between the n-type semiconductor layer and the active layer.

6. The device according to claim 1, wherein the first insertion layer or the second insertion layer has a thickness of 5 to 50 Å.

7. The device according to claim 1, wherein the plurality of second insertion layers comprises AlGaInN.

* * * * *